United States Patent [19]

Yeh et al.

[11] Patent Number: 5,393,686

[45] Date of Patent: Feb. 28, 1995

[54] METHOD OF FORMING GATE OXIDE BY TLC GETTERING CLEAN

[75] Inventors: Wei-kun Yeh; J. S. Shiao, both of Hsinchu; A. M. Chiang, Hsin-Chu, all of Taiwan, Prov. of China

[73] Assignee: Taiwan Semiconductor Manufacturing Company, Hsinchu, Taiwan, Prov. of China

[21] Appl. No.: 297,502

[22] Filed: Aug. 29, 1994

[51] Int. Cl.$^6$ .......................................... H01L 21/266
[52] U.S. Cl. ..................................... 437/45; 437/43; 437/239; 148/DIG. 24
[58] Field of Search ............... 437/10, 43, 45, 239, 437/939, 946; 148/DIG. 17, DIG. 24, DIG. 60

[56] References Cited

U.S. PATENT DOCUMENTS

| | | | |
|---|---|---|---|
| 5,089,441 | 2/1992 | Moslehi | 437/225 |
| 5,210,056 | 5/1993 | Pong et al. | 437/239 |
| 5,225,355 | 7/1993 | Sugino et al. | 437/10 |
| 5,229,334 | 7/1993 | Kato | 437/239 |
| 5,296,411 | 3/1994 | Gardner et al. | 437/45 |
| 5,316,981 | 5/1994 | Gardner et al. | 437/239 |

Primary Examiner—Tom Thomas
Assistant Examiner—Chandra Chaudhari
Attorney, Agent, or Firm—George O. Saile

[57] ABSTRACT

A new method of forming a high quality silicon oxide under a gate electrode for an integrated circuit is described. A gate silicon oxide layer is formed for the gate electrode. A blockout mask is provided for all areas of the integrated circuit not requiring an ion implant. The ion implant is implanted through the gate silicon oxide layer into those areas not covered by the blockout mask. The blockout mask is removed. The gate silicon oxide layer is cleaned to improve the electrical breakdown and charge breakdown characteristics to the state they were before the mask and ion implanting steps by a) treating the gate silicon oxide layer with ammonia and peroxide fluid in the concentration $NH_4OH:H_2O_2:H_2O = (0.4-1):1:5.5$ for between about 3 to 7 minutes at a temperature of between about 60° to 80° C. and b) subjecting the gate silicon oxide layer to an atmosphere of $C_2H_2Cl_2$ and excess oxygen at a temperature of between about 775° to 875° C. for a time of between about 5 to 25 minutes. A polysilicon layer is deposited over the gate silicon oxide layer and patterned to form the gate electrode.

4 Claims, 2 Drawing Sheets

METHOD OF FORMING GATE OXIDE BY TLC GETTERING CLEAN

BACKGROUND OF THE INVENTION (1) Field of the Invention

The invention relates to a method of improving gate silicon oxide quality in the fabrication of integrated circuits, and more particularly, to a method of improving gate silicon oxide quality after ion implant in the fabrication of gate electrodes for an EPROM integrated circuit.

(2) Description of the Prior Art

Ion implantation to dope the substrate is a common practice in semiconductor manufacturing. For example, a threshold voltage ion implant is typically performed through a gate oxide layer into the semiconductor substrate before the formation of a gate electrode. A photoresist layer protects those areas of the substrate where the ion implantation is not desired. Both the ion implantation and the photoresist removal cause physical damage to the gate oxide layer causing degraded electrical breakdown and charge breakdown characteristics. This is especially critical with electrical programmable read only memory (EPROM) and erasable electrical programmable read only memory (EEPROM) devices.

U.S. Pat. No. 5,089,441 to Moslehi shows cleaning of metallic contaminants with halogen containing gas, such as HCl or HF. U.S. Pat. No. 5,225,355 to Sugino et al shows that HCl gettering can be used to clean or neutralize silicon oxide layers. No mention is made in either of these patents of damage to the gate silicon oxide caused by ion implantation.

SUMMARY OF THE INVENTION

A principal object of the present invention is to provide an effective and very manufacturable method of forming gate electrodes in the fabrication of an integrated circuit.

Another object of the present invention is to provide an effective and very manufacturable method of forming the peripheral device gate electrode of an EPROM device integrated circuit.

Yet another object of the invention is to form a high quality gate silicon oxide in the fabrication of a peripheral device gate electrode of an EPROM device integrated circuit.

Yet another object of the invention is to improve the electrical breakdown characteristics of the gate silicon oxide after ion implant to before ion implant conditions.

Yet another object is to improve the charge breakdown characteristics of the gate silicon oxide after ion implant to before ion implant conditions.

A further object of the invention is to form a high quality tunnel oxide in the fabrication of a gate electrode of an EEPROM device integrated circuit.

In accordance with the objects of this invention a new method of forming a high quality silicon oxide under a gate electrode for an integrated circuit is achieved. A gate silicon oxide layer is formed for the gate electrode. A blockout mask is provided for all areas of the integrated circuit not requiring an ion implant. The ion implant is implanted through the gate silicon oxide layer into those areas not covered by the blockout mask. The blockout mask is removed. The gate silicon oxide layer is cleaned to improve the electrical breakdown and charge breakdown characteristics to the state they were before the mask and ion implanting steps by a) treating the gate silicon oxide layer with ammonia and peroxide fluid in the concentration $NH_4OH:H_2O_2:H_2O = (0.4-1):1:5.5$ for between about 3 to 7 minutes at a temperature of between about 60° to 80° C. and b) subjecting the gate silicon oxide layer to an atmosphere of $C_2H_2Cl_2$ and excess oxygen at a temperature of between about 775° to 875° C. for a time of between about 5 to 25 minutes. A polysilicon layer is deposited over the gate silicon oxide layer and patterned to form the gate electrode.

BRIEF DESCRIPTION OF THE DRAWINGS

In the accompanying drawings forming a material part of this description, there is shown.

DESCRIPTION OF THE PREFERRED EMBODIMENTS

Figure 1:
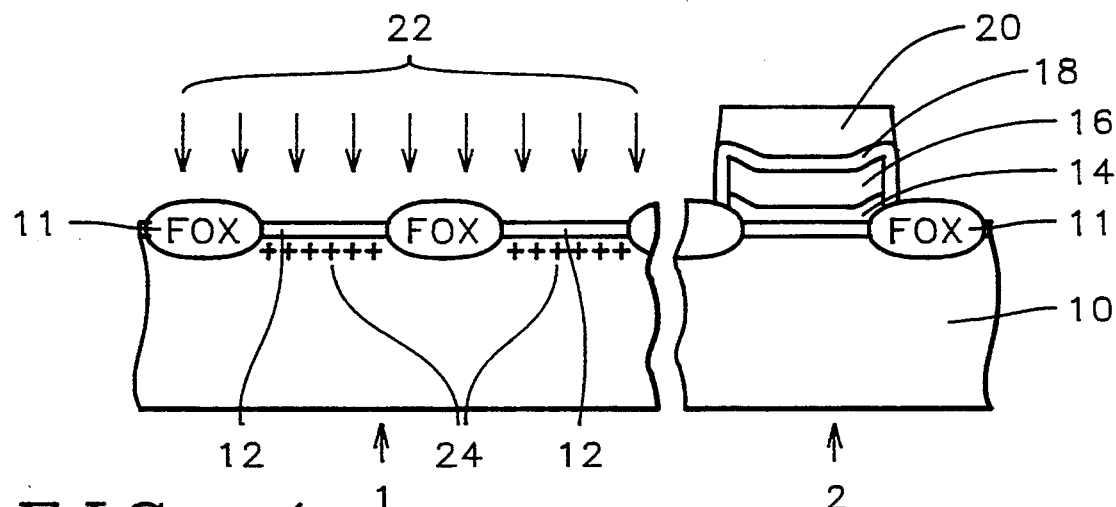
FIGS. 1 through 3 schematically illustrate in cross-sectional representations one preferred embodiment of the present invention for an EPROM device.

Referring now more particularly to FIG. 1, there is illustrated a portion of a partially completed EPROM integrated circuit where a peripheral gate electrode is to be formed. The peripheral area of the integrated circuit is labeled 1. The EPROM device array area is labeled 2. There is shown a semiconductor substrate 10, preferably composed of monocrystalline silicon. Field oxide regions 11 are formed as is conventional in the art. The floating gate of the EPROM is fabricated in the array area 2 of the integrated circuit. Silicon oxide layer 14, polysilicon floating gate 16, and interpoly dielectric layer 18 are shown.

A threshold voltage ion implant is to be made into the peripheral area 1 of the integrated circuit. It is desirable to make the threshold voltage ion implant after the gate silicon oxide layer has been formed. If the ion implant were done before the gate silicon oxide layer were formed, it would require a higher implant dosage because the subsequent gate silicon oxide growth will consume some of the dose, degrading device performance especially in a PMOS device. Secondly, the buffer oxide used for the implant would be the periphery remaining oxide whose uniformity is not good as a gate oxide.

A layer of gate silicon oxide 12 is grown on the surface of the semiconductor substrate in the peripheral area 1 of the integrated circuit to a thickness of between about 170 to 220 Angstroms. A layer of photoresist is coated over the gate silicon oxide and patterned to provide a blockout mask 20 covering those portions of the EPROM integrated circuit, including the EPROM device area itself, which do not require a threshold voltage implant. A threshold voltage ion implant 22 is implanted through the gate silicon oxide layer 12 not covered by the blockout mask 20 into the semiconductor substrate 24. $BF_2+$ ions are implanted at a dosage of between about 7 E 11 to 1.2 E 12 atoms/$cm^2$ and energy of between about 40 to 60 KeV.

The high energy bombardment of the threshold voltage ions through the silicon oxide layer 12 causes physical damage to the gate silicon oxide layer. The photoresist coating is removed using, for example, oxygen plasma ashing and sulfuric acid and hydrogen peroxide. The photoresist removal also causes damage, resulting in degraded electrical breakdown and charge breakdown characteristics.

A two-step cleaning process is used in the prior art. A first cleaning using $NH_4OH$ removes particles from the surface of the silicon oxide layer. A second cleaning using HCL removes metal contamination which comes from the photoresist removing steps.

An annealing at about 800° C. can restore the electrical breakdown characteristics of the implanted gate silicon oxide to pre-implant conditions. However, the charge breakdown characteristics are still poor.

The TLC Gettering Clean process of the present invention replaces the prior art two-step cleaning process and also consists of two steps. TLC is an abbreviation for Trans 1, 2-Dichlorethylene ($C_2H_2Cl_2$) which is used as a liquid source material for the in situ generation of ultra high purity HCl in semiconductor operations, such as silicon oxidation and tube cleaning. First, the gate silicon oxide layer is treated with a solution of ammonia, hydrogen peroxide and water in the concentration (0.4–1):1:5.5 at a temperature of between about 60° to 80° C. for between about 3 to 7 minutes. This step removes particles and cleans the gate silicon oxide surface. Next, the gate silicon oxide is subjected to an atmosphere of $C_2H_2Cl_2$ and excess oxygen at a temperature of between about 775° to 875° C. for between about 5 to 25 minutes. The flow rates of the gases are in the ratio $C_2H_2Cl_2:O_2=0.26:10$ sccm. This step getters away the metal contamination left on the silicon oxide surface by the photoresist removal process.

The chemical reaction seen in the second step is:

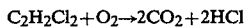
$$C_2H_2Cl_2+O_2\rightarrow 2CO_2+2HCl$$

The excess oxygen yields excess HCl which removes metal contamination to restore the charge breakdown characteristics to normal. The HCl reacts with the metal contaminants, as in this example:

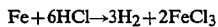
$$Fe+6HCl\rightarrow 3H_2+2FeCl_3$$

$FeCl_3$ is electrically inactive so it will not act as an electron trap or a hole trap.

The high temperature of between about 775°–875° C. is low enough to keep to the thermal budget, but is high enough to activate the metal diffusion across the silicon and the gate silicon oxide and to increase the probability of the HCl and metal reaction given above.

After the TLC Gettering Clean of the invention, the gate silicon oxide quality is as good as that for normal wafers. Process integration and physical architecture remain the same. The thickness of the gate silicon oxide increases by about 10 Angstroms after the TLC Gettering Clean because the oxygen gas used in the second cleaning step will react with the silicon substrate to form silicon dioxide. The device will be unaffected by this thickness increase, but if desired, the gate oxide target growth can be adjusted to 10 Angstroms less than the desired thickness so that the final gate oxide thickness will be the same as in the original process. Annealing the implanted gate oxide before polysilicon deposition improves the gate silicon oxide quality.

Figure 2:
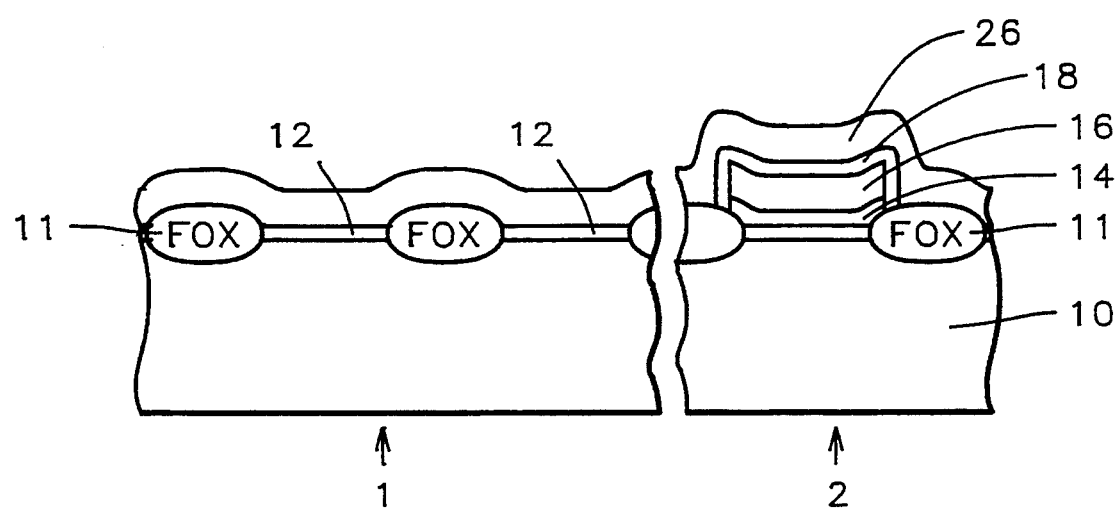
Figure 3:
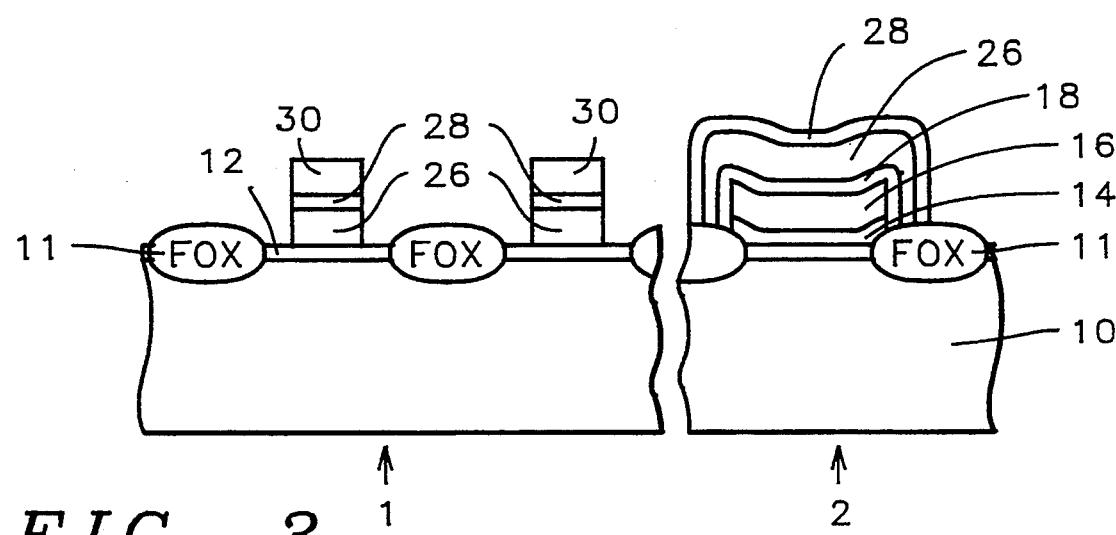

After the TLC Gettering Clean process, the second polysilicon layer 26 can be deposited, as illustrated in FIG. 2. This layer is patterned to form the control gate of the EPROM device in the array area 2 shown in FIG. 3. Dielectric layer 28 is deposited, followed by polycide layer 30. The polysilicon 26, dielectric 28, and polycide 30 layers in the peripheral area 1 are patterned to form peripheral gate electrodes as shown in FIG. 3.

The process of the present invention may be used in making peripheral device gate electrodes for an EPROM device integrated circuit, as described above. It will be obvious to those skilled in the art that the cleaning process of the invention may be used also in making other devices and integrated circuits requiring ion implantation through gate silicon oxide.

Figure 4:
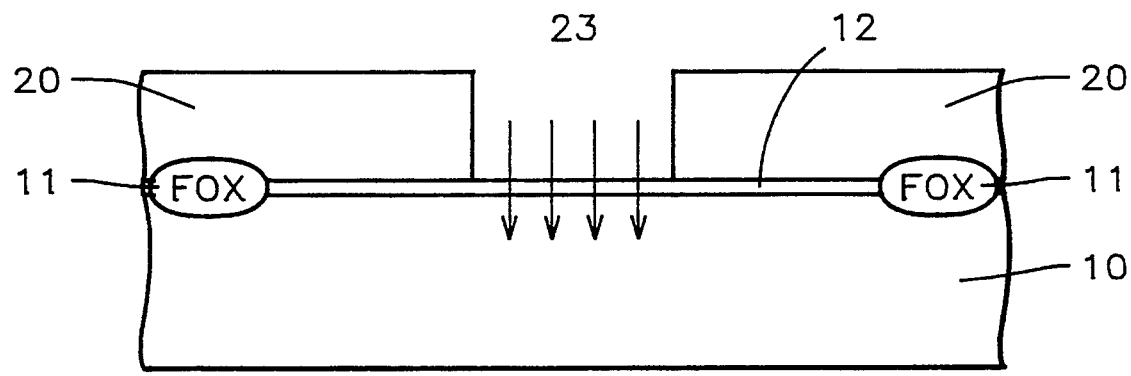
FIGS. 4 through 6 schematically illustrate in cross-sectional representation a second preferred embodiment of the present invention for an EEPROM device.

Another example of the use of the TLC Gettering Clean process of the invention is described with reference to FIGS. 4 through 6 for an EEPROM device integrated circuit. Referring now more particularly to FIG. 4, there is shown a partially completed integrated circuit with a monocrystalline semiconductor substrate 10. Field oxide regions 11 are formed as is conventional in the art. A silicon oxide layer 12 is grown on the surface of the semiconductor substrate. A layer of photoresist is coated over the silicon oxide layer 12 and patterned to provide a blockout mask 20 covering those portions of the EEPROM integrated circuit except for the area where the tunnel oxide is to be formed.

Figure 5:
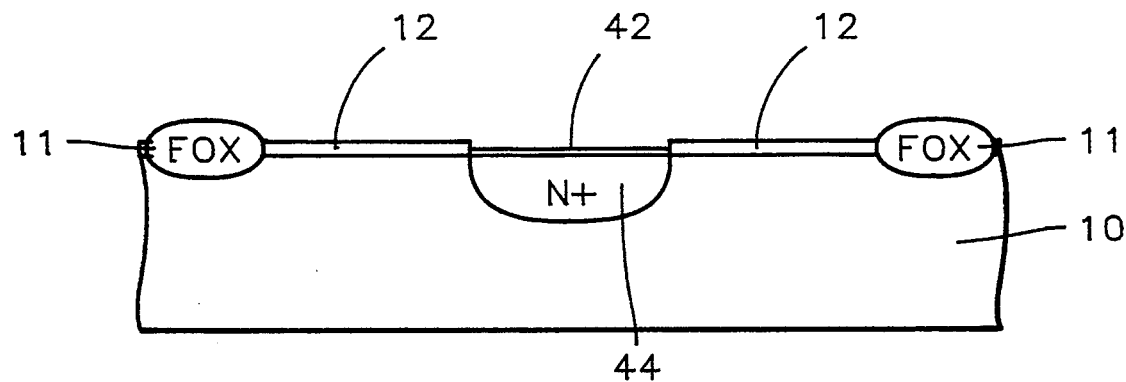
Figure 6:
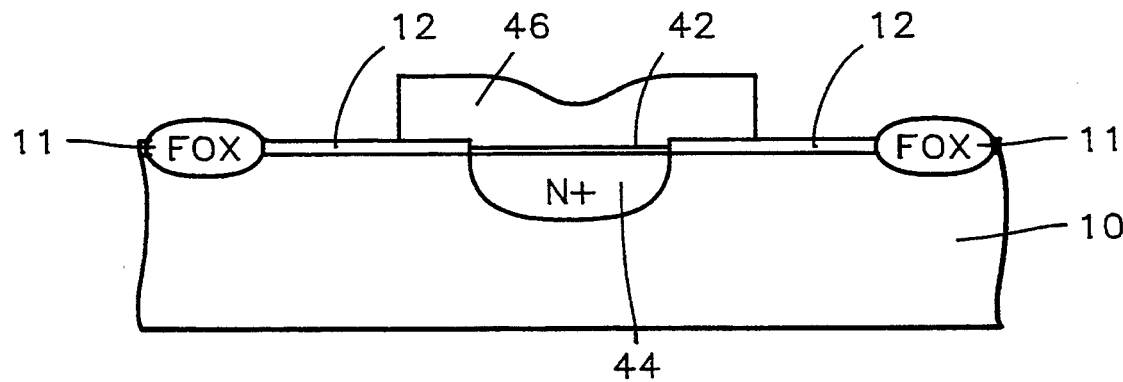

An injection oxide implant 23 is performed through the silicon oxide 12 into the semiconductor substrate, forming N+ implanted region 44, shown in FIG. 5. The silicon oxide layer not covered by the photoresist is etched away exposing the implanted portion of the semiconductor substrate. The photoresist layer is stripped.

The TLC Gettering Clean process of the invention is used to remove particles and to getter away metal contamination on the surface of the semiconductor substrate. The thin tunnel silicon oxide 42 is grown on the cleaned surface of the semiconductor substrate. A polysilicon layer is deposited and patterned to form the polysilicon gate 46 of the EPPROM device integrated circuit, as seen in FIG. 6.

While the invention has been particularly shown and described with reference to the preferred embodiments thereof, it will be understood by those skilled in the art that various changes in form and details may be made without departing from the spirit and scope of the invention.

What is claimed is:

1. The method for forming a gate electrode for an integrated circuit comprising:

forming a gate silicon oxide layer for said gate electrode;

providing a blockout mask for all areas of said integrated circuit not requiring a threshold voltage ion implant;

ion implanting said threshold voltage ion implant through said gate silicon oxide layer into those areas not covered by said blockout mask;

removing said blockout mask;

cleaning said gate silicon oxide layer to improve the electrical breakdown and charge breakdown characteristics to said gate silicon oxide layer condition before said mask and said ion implanting steps by
 a) treating said gate silicon oxide layer with ammonia and peroxide fluid in the concentration $NH_4OH: H_2O_2: H_2O=(0.4-1):1:5.5$ for between about 3 to 7 minutes at a temperature of between about 60° to 80° C. and
 b) subjecting said gate silicon oxide layer to an atmosphere of $C_2H_2Cl_2$ and excess oxygen at a temperature of between about 775° to 875° C. for a time of between about 5 to 25 minutes; and depositing a polysilicon layer over said gate silicon oxide layer and patterning said polysilicon layer to form said gate electrode.

2. The method for forming the peripheral device gate electrode for an EPROM device integrated circuit comprising:

forming a gate silicon oxide layer for said peripheral device gate electrode;

providing a blockout mask for all areas of said EPROM integrated circuit including the EPROM device area itself not requiring a threshold voltage ion implant;

ion implanting said threshold voltage ion implant through said gate silicon oxide layer into those areas not covered by said blockout mask;

removing said blockout mask; cleaning said gate silicon oxide layer to improve the electrical breakdown and charge breakdown characteristics to said gate silicon oxide layer condition before said mask and said ion implanting steps by
  a) treating said gate silicon oxide layer with ammonia and peroxide fluid in the concentration $NH_4OH: H_2O_2: H_2O = (0.4-1):1:5.5$ for between about 3 to 7 minutes at a temperature of between about 60° to 80° C. and
  b) subjecting said gate silicon oxide layer to an atmosphere of $C_2H_2Cl_2$ and excess oxygen at a temperature of between about 775° to 875° C. for a time of between about 5 to 25 minutes; and depositing a polysilicon layer over said gate silicon oxide layer and patterning said polysilicon layer to form said peripheral gate electrode.

3. The method of claim 2 wherein said threshold voltage ion implant comprises $BF_2+$ ions implanted at the dosage of between about 7 E 11 to 1.2 E 12 atoms/cm$^2$ and energy of between about 40 to 60 KeV.

4. The method for forming a gate electrode for an EEPROM device integrated circuit comprising:

forming a gate silicon oxide layer for said gate electrode;

providing a blockout mask for all areas of said EEPROM integrated circuit except for planned tunnel oxide area;

ion implanting an injection oxide ion implant through said gate silicon oxide layer not covered by said blockout mask into said semiconductor substrate forming an implanted region under said planned tunnel oxide area;

removing said blockout mask;

cleaning said gate silicon oxide layer to improve the electrical breakdown and charge breakdown characteristics to said gate silicon oxide layer condition before said mask and said ion implanting steps by
  a) treating said gate silicon oxide layer with ammonia and peroxide fluid in the concentration $NH_4OH: H_2O_2: H_2O = (0.4-1):1:5.5$ for between about 3 to 7 minutes at a temperature of between about 60° to 80° C. and
  b) subjecting said gate silicon oxide layer to an atmosphere of $C_2H_2Cl_2$ and excess oxygen at a temperature of between about 775° to 875° C. for a time of between about 5 to 25 minutes; and growing a tunnel oxide layer on the surface of said semiconductor substrate overlying said implanted region;

depositing a polysilicon layer over said gate silicon oxide layer and said tunnel oxide layer and patterning said polysilicon layer to form said gate electrode of said EEPROM device integrated circuit.

* * * * *